US011076515B1

(12) United States Patent
Li et al.

(10) Patent No.: US 11,076,515 B1
(45) Date of Patent: Jul. 27, 2021

(54) CABLE AND MANUFACTURING METHOD THEREOF

(71) Applicant: LUXSHARE PRECISION INDUSTRY Co., Ltd., Shenzhen (CN)

(72) Inventors: HuaBing Li, Shenzhen (CN); Yu Huang, Shenzhen (CN)

(73) Assignee: LUXSHARE PRECISION INDUSTRY CO., LTD., Shenzhen (CN)

( * ) Notice: Subject to any disclaimer, the term of this patent is extended or adjusted under 35 U.S.C. 154(b) by 0 days.

(21) Appl. No.: 16/901,390

(22) Filed: Jun. 15, 2020

(30) Foreign Application Priority Data

Mar. 24, 2020 (CN) .......................... 202010214630.4

(51) Int. Cl.
*H05K 9/00* (2006.01)
*H01B 7/18* (2006.01)
(Continued)

(52) U.S. Cl.
CPC ........... *H05K 9/0098* (2013.01); *H01B 7/187* (2013.01); *H01B 13/227* (2013.01);
(Continued)

(58) Field of Classification Search
None
See application file for complete search history.

(56) References Cited

U.S. PATENT DOCUMENTS

| 2,802,767 A * | 8/1957 | Mighton | ................. | B29C 70/12 |
| | | | | 156/83 |
| 3,632,720 A * | 1/1972 | Mildner | .................... | H01B 7/29 |
| | | | | 264/171.18 |

(Continued)

FOREIGN PATENT DOCUMENTS

| CN | 103137264 A | 6/2013 |
| CN | 105047269 A | 11/2015 |

(Continued)

OTHER PUBLICATIONS

JP01026435_English_translation_Jplatpat. (Year: 1989).*
CN106205841_English_translation_Espacenet (Year: 2017).*

*Primary Examiner* — Timothy J. Dole
*Assistant Examiner* — Muhammed Azam
(74) *Attorney, Agent, or Firm* — Birch, Stewart, Kolasch & Birch LLP

(57) ABSTRACT

A cable includes a wire and an electromagnetic shielding layer. The electromagnetic shielding layer covers the wire. The electromagnetic shielding layer is in the form of fiber mesh, including a conductive polymer. A manufacturing method includes: feeding the conductive polymer, melting the conductive polymer, extruding the molten conductive polymer to form a plurality of conductive polymer fibers, covering the wire with the plurality of conductive polymer fibers, and curing the plurality of the conductive polymer fibers to form the electromagnetic shielding layer covering the wire. The electromagnetic shielding layer of the cable of the present application replaces current aluminum foil shielding and metal shielding for conventional wires, decreasing interference by electromagnetic waves produced by electromagnetic induction on electronic devices nearby.

8 Claims, 8 Drawing Sheets

(51) Int. Cl.
   *H01B 13/22*   (2006.01)
   *H01B 13/24*   (2006.01)

(52) U.S. Cl.
   CPC ........... *H01B 13/228* (2013.01); *H01B 13/24* (2013.01); *H05K 9/009* (2013.01)

(56) References Cited

U.S. PATENT DOCUMENTS

| | | | | |
|---|---|---|---|---|
| 3,708,335 A * | 1/1973 | Nagae | ..................... | D06Q 1/04 442/202 |
| 3,795,540 A * | 3/1974 | Mildner | ................. | B32B 15/08 428/215 |
| 3,823,035 A * | 7/1974 | Sanders | ................... | D06Q 1/04 428/368 |
| 3,998,988 A * | 12/1976 | Shimomai | ............... | A24D 3/08 428/400 |
| 4,220,616 A * | 9/1980 | Pfeiffer | .................... | D01D 4/02 264/206 |
| 4,234,648 A * | 11/1980 | Patz | ........................ | B29C 70/16 442/229 |
| 4,454,379 A * | 6/1984 | Cleveland | ........... | H01B 7/2825 174/107 |
| 4,486,490 A * | 12/1984 | Patz | ........................ | B29C 70/16 427/383.5 |
| 4,501,928 A * | 2/1985 | Ishitobi | ................... | B32B 15/08 174/107 |
| 4,626,619 A * | 12/1986 | Uematsu | .............. | H01B 7/2825 174/106 R |
| 4,684,762 A * | 8/1987 | Gladfelter | .............. | D03D 15/00 174/36 |
| 4,725,693 A * | 2/1988 | Hirsch | ................... | B32B 15/08 174/107 |
| 4,740,412 A * | 4/1988 | Hocker | ............... | H01L 51/0041 428/194 |
| 4,767,894 A * | 8/1988 | Schombourg | ........... | H01B 3/44 174/106 SC |
| 5,391,432 A * | 2/1995 | Mitchnick | ................ | C01G 9/02 428/357 |
| 6,284,374 B1 * | 9/2001 | Yamazaki | ................. | B32B 7/06 174/105 SC |
| 6,436,517 B1 * | 8/2002 | Zahn | ................... | B29C 45/0003 174/250 |
| 9,093,191 B2 * | 7/2015 | Hiel | ......................... | H02G 7/04 |
| 9,805,844 B2 * | 10/2017 | Bopp | ....................... | H01B 11/08 |
| 9,899,128 B1 * | 2/2018 | Boyer | ..................... | H01B 13/26 |
| 9,901,018 B1 * | 2/2018 | Richmond | ............. | H01B 3/004 |
| 10,095,149 B1 * | 10/2018 | Tomari | ............... | G03G 15/0233 |
| 10,400,364 B1 * | 9/2019 | Mayer | ..................... | D02G 3/441 |
| 10,535,448 B2 * | 1/2020 | Henriksen | ............. | H01B 9/02 |
| 10,872,712 B2 * | 12/2020 | Kaga | ....................... | H01B 3/441 |
| 2002/0053446 A1 * | 5/2002 | Moe | ................... | H01B 11/1839 174/21 C |
| 2002/0195260 A1 * | 12/2002 | Marks | ................. | D04C 1/06 174/351 |
| 2006/0151194 A1 * | 7/2006 | Varkey | ................. | H01B 13/141 174/102 R |
| 2007/0000682 A1 * | 1/2007 | Varkey | ................... | D07B 1/147 174/102 R |
| 2007/0107928 A1 * | 5/2007 | Varkey | ................. | H01B 13/141 174/102 R |
| 2008/0083499 A1 * | 4/2008 | Nodono | ................ | H01M 8/103 156/324 |
| 2009/0321238 A1 * | 12/2009 | Nhan | ..................... | B32B 5/022 200/5 A |
| 2010/0093245 A1 * | 4/2010 | Bradley | ................... | D04H 1/46 442/341 |
| 2012/0070612 A1 * | 3/2012 | Lee | ......................... | H01B 1/04 428/141 |
| 2012/0315065 A1 * | 12/2012 | Akiba | ................... | D06M 11/74 399/175 |
| 2013/0216857 A1 * | 8/2013 | Dhar | ....................... | H01B 1/02 428/615 |
| 2013/0233592 A1 * | 9/2013 | Li | ............................ | H01B 1/24 174/119 R |
| 2014/0025007 A1 * | 1/2014 | Fink | ........................ | H01B 1/24 604/131 |
| 2014/0124237 A1 * | 5/2014 | Demers | .................. | B32B 3/085 174/115 |
| 2014/0166335 A1 * | 6/2014 | Kagoura | .............. | H01B 7/2825 174/107 |
| 2014/0217332 A1 * | 8/2014 | Simmons | ................... | C08J 5/24 252/511 |
| 2014/0329082 A1 * | 11/2014 | Divigalpitiya | ......... | H01B 1/127 428/336 |
| 2014/0378019 A1 * | 12/2014 | Auktun | .................. | C09J 165/02 442/151 |
| 2015/0013875 A1 * | 1/2015 | Siebert | ............... | H01B 13/0013 156/53 |
| 2015/0140885 A1 * | 5/2015 | Eder | ..................... | D06M 11/45 442/136 |
| 2015/0237771 A1 * | 8/2015 | Natter | .................. | H02G 15/025 174/77 R |
| 2015/0318555 A1 * | 11/2015 | Oku | ..................... | B32B 27/283 429/245 |
| 2015/0321908 A1 * | 11/2015 | Wagner | ................. | B29C 39/003 428/423.1 |
| 2016/0083584 A1 * | 3/2016 | Meure | ..................... | B32B 27/12 442/181 |
| 2016/0107739 A1 * | 4/2016 | Restuccia | ................. | B32B 5/26 428/114 |
| 2016/0155537 A1 * | 6/2016 | Manabe | ..................... | B32B 1/08 174/107 |
| 2016/0155717 A1 * | 6/2016 | Saruyama | ................ | H01R 4/04 428/156 |
| 2016/0215441 A1 * | 7/2016 | Wang | ......................... | C08J 5/10 |
| 2016/0272343 A1 * | 9/2016 | Jeschke | .................. | D21H 13/50 |
| 2017/0044653 A1 * | 2/2017 | Pollitt | .................... | H01B 13/22 |
| 2017/0069405 A1 * | 3/2017 | Yust | ........................ | H01B 1/24 |
| 2017/0287595 A1 * | 10/2017 | Holzmueller | ....... | F04D 13/0693 |
| 2017/0298568 A1 * | 10/2017 | Kramer | ................. | D06M 10/10 |
| 2017/0325337 A1 * | 11/2017 | Karagozler | ........... | G06F 3/0446 |
| 2017/0370026 A1 * | 12/2017 | Perera | ..................... | D02G 3/36 |
| 2018/0303013 A1 * | 10/2018 | Li | ........................ | H05K 9/0088 |
| 2018/0304578 A1 * | 10/2018 | Audenaert | ................ | C08J 5/24 |
| 2018/0340072 A1 * | 11/2018 | Anstine | ................... | C09C 1/009 |
| 2019/0062958 A1 * | 2/2019 | Bykova | ................... | D06M 7/00 |
| 2019/0378635 A1 * | 12/2019 | Parris | ..................... | D07B 1/147 |
| 2020/0219637 A1 * | 7/2020 | Ahn | ....................... | H01B 7/187 |

FOREIGN PATENT DOCUMENTS

| | | | | |
|---|---|---|---|---|
| CN | 106205841 B | 8/2017 | | |
| CN | 109418961 A | 3/2019 | | |
| CN | 208752990 U | 4/2019 | | |
| CN | 110753976 A | 2/2020 | | |
| JP | 01026435 A | * | 5/1989 | ........... D04H 1/4242 |
| TW | 201621925 A | 6/2016 | | |

* cited by examiner

CABLE AND MANUFACTURING METHOD THEREOF

CROSS REFERENCE TO RELATED APPLICATION

This application claims the priority benefit of Chinese Patent Application Serial Number CN202010214630.4, filed on Mar. 24, 2020, the full disclosure of which is incorporated herein by reference.

BACKGROUND

Technical Field

The present disclosure relates to the technical field of wires, particularly to a cable and manufacturing method thereof.

Related Art

When a conventional cable is energized, the cable would interfere with surrounding electronic equipments with the electromagnetic waves generated by the electromagnetic induction effect. Therefore, most of the materials of a shielding layer used to cover the wires in the cable are a combination of metal and aluminum foil to shield electromagnetic waves. However, the performance of the shielding of the conventional combination of metal and aluminum foil used for the shielding layer needs to be improved.

SUMMARY

The embodiments of the present disclosure provide a cable and a manufacturing method thereof to solve the problem of ineffective shielding of the shielding layer consist of metal and aluminum foil used to shield the electromagnetic waves when wires are energized.

Firstly, the present disclosure provides a cable comprising a wire and an electromagnetic shielding layer covering the wire. The electromagnetic shielding layer is in the form of fiber mesh and comprises a conductive polymer.

Secondly, the present disclosure provides a manufacturing method of a cable comprising the steps of feeding the conductive polymer; melting the conductive polymer; extruding the molten conductive polymer to form a plurality of conductive polymer fibers; covering the wire with the plurality of conductive polymer fibers; and curing the plurality of the conductive polymer fibers to form the electromagnetic shielding layer covering the wire.

In the embodiments of the present disclosure, the electromagnetic shielding layer having the conductive polymer is highly resistant to electromagnetic interference. By covering wires with electromagnetic shielding layer having conductive polymer, the performance of electromagnetic shielding can be greatly increased.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
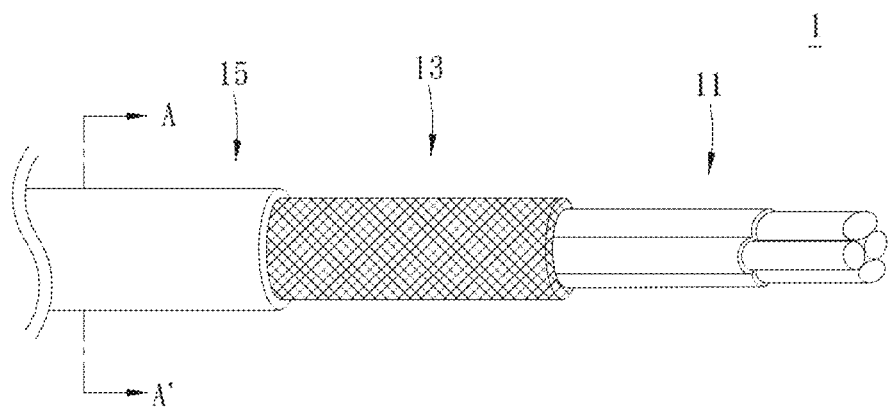
FIG. 1 is a perspective view of a cable of the first embodiment of the present disclosure.

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

In the following embodiment, the same reference numerals are used to refer to the same or similar elements throughout the disclosure.

Figure 2:
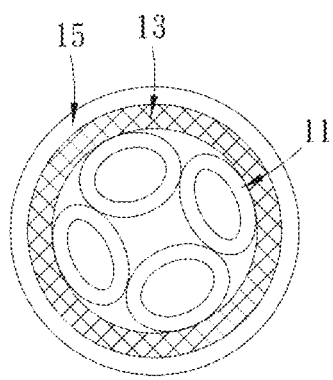
FIG. 2 is a cross-sectional view along line AA' of FIG. 1.

FIG. 1 is a perspective view of a cable of the first embodiment of the present disclosure. FIG. 2 is a cross-sectional view along line AA' of FIG. 1. As shown in the figure, this embodiment provides a cable 1 comprising a wire 11 and an electromagnetic shielding layer 13. The cable of this embodiment is a power supplying cord, comprising a plurality of wires 11 inside the cable 1. The electromagnetic shielding layer 13 covers the wires 11. The electromagnetic shielding layer 13 is in the form of fiber mesh and comprises a conductive polymer. In one embodiment, the conductive polymer includes polypropylene and is doped with conductive particles. The material of the conductive particles could be metal or carbon, but is not limited thereto.

In addition to polypropylene, the conductive polymer of this embodiment further includes polyester, acrylic acid, polyamide, and viscose fibers. In some embodiments, the polypropylene weighs 60% to 64% of the conductive polymer. The polyester weighs 20% to 24% of the conductive polymer. The acrylic acid weighs 0.5% to 2% of the conductive polymer. The polyamide weighs 0.5% to 2% of the conductive polymer. The viscose fiber weighs 2% to 6% of the conductive polymer.

The composition ratios for the additives in the conductive polymer in practice in an embodiment are as follows. The polypropylene weighs 63% of the conductive polymer. The polyester weighs 23% of the conductive polymer. The acrylic acid weighs 2% of the conductive polymer. The polyamide weighs 1.5% of the conductive polymer. The viscose fiber weighs 8% of the conductive polymer. All the rest material weighs 3% of the conductive polymer. This is merely one embodiment of the present application forming a conductive polymer for this embodiment.

In one embodiment, as shown in FIG. 1 and FIG. 2, the cable 1 further includes a protective outer layer 15 covering the electromagnetic shielding layer 13. The protective outer layer 15 can be waterproof and dustproof, to more completely protect the electromagnetic shielding layer 13.

Figure 3:
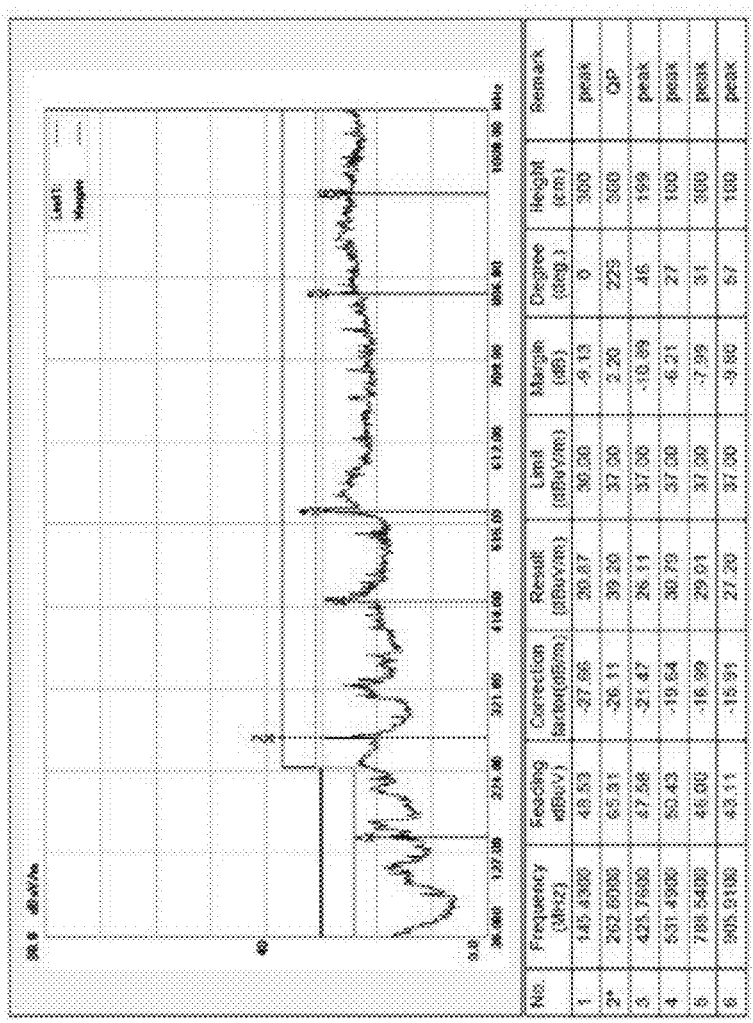
FIG. 3 is a data chart of electromagnetic wave shielding performance by metal and aluminum foil layer of the prior art.
Figure 4:
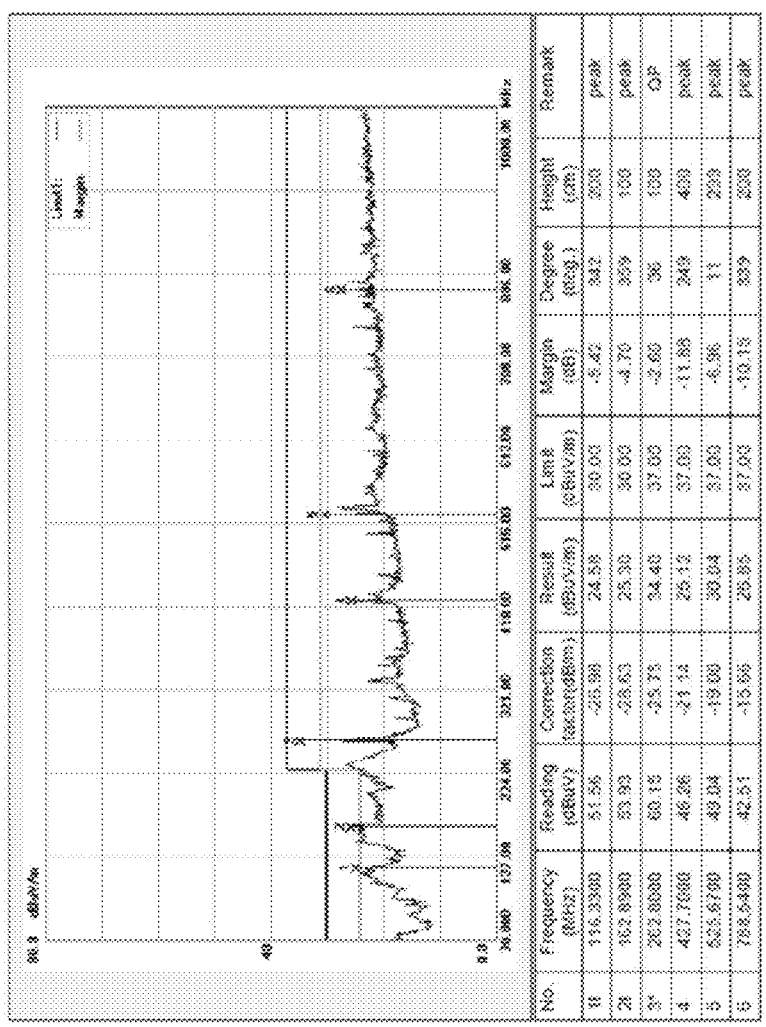
FIG. 4 is a data chart of electromagnetic wave shielding performance by electromagnetic layer of the present disclosure.

FIG. 3 is a data chart of electromagnetic wave shielding performance by metal and aluminum foil layer of the prior art. FIG. 4 is a data chart of electromagnetic wave shielding performance by electromagnetic layer of the present disclosure. In this embodiment, it is to test the actual effect of shielding electromagnetic waves after covering the outside of the plurality of wires 11 with the electromagnetic shielding layer 13. The figure shows the electromagnetic wave frequency as the X axis and the electromagnetic wave intensity as the Y axis. FIG. 3 shows the shielding effect on the electromagnetic waves generated by energized cable shielded by metal and aluminum foil in the prior art. In the case of an electromagnetic wave frequency of 262.8, the electromagnetic wave intensity would exceed the threshold of 37 dBuV/m marked by Limit1. FIG. 4 shows the shielding effect on the electromagnetic waves generated by energized cable shielded by the electromagnetic shielding layer 13 under the same circumstance as FIG. 3. In the case where the electromagnetic wave frequency is 262.8, the electromagnetic wave intensity does not exceed the threshold of 37 dBuV/m marked by Limit1. The above description shows that the application of the electromagnetic shielding layer 13 having a conductive polymer performs a better shielding effect on electromagnetic waves.

Figure 5:
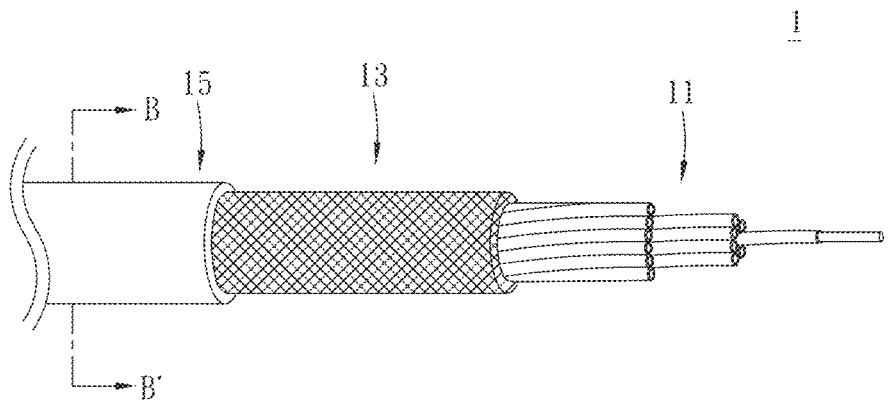
FIG. 5 is a perspective view of a cable of the second embodiment of the present disclosure.
Figure 6:
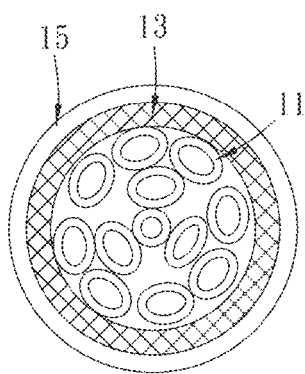
FIG. 6 is a cross-sectional view along line BB' of FIG. 5.

FIG. 5 is a perspective view of a cable of the second embodiment of the present disclosure. FIG. 6 is a cross-sectional view along line BB' of FIG. 5. As shown in the figures, the difference between the cable 1 of this embodiment and that of the first embodiment lies in the quantity and arrangement of the wires 11. The cable 1 of this embodiment is a connecting wire. The quantity and arrangement of the wires 11 are different from those of the wires in the power supplying cord. The internal wires in this embodiment are plural thin wires. Therefore, the quantity and arrangement of wires in the cable of the present disclosure vary according to the purpose of the cable, and should not be limited thereto. The cable of the present disclosure mainly covers the wire through the electromagnetic shielding layer, which can effectively shield the electromagnetic signal generated by the wire during the use of the cable.

Figure 7:
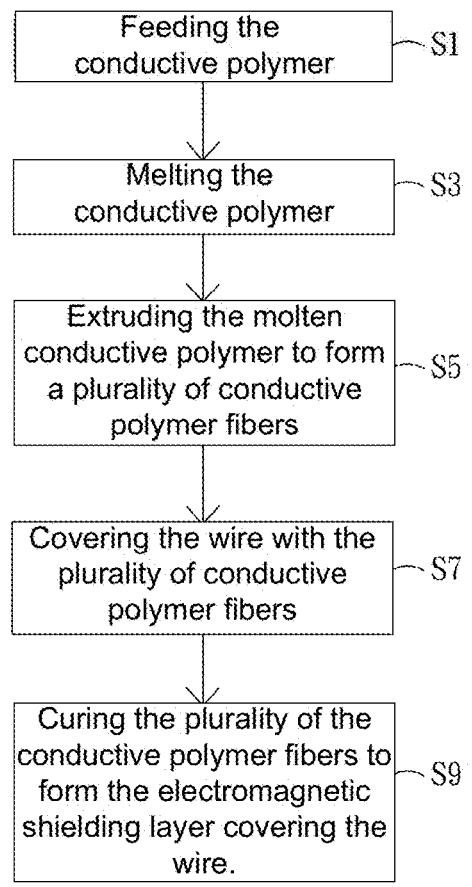
FIG. 7 is a flowchart of a manufacturing method of a cable of the third embodiment of the present disclosure.

FIG. 7 is a flowchart of a manufacturing method of a cable of the third embodiment of the present disclosure. As shown in the figure, this embodiment provides a method for manufacturing a cable, which can be applied to manufacture the cables of the first and second embodiments. The manufacturing method of the cable of this embodiment starts with step S1: feeding the conductive polymer, in which the step further includes doping conductive particles into polypropylene to form the conductive polymer. When doping conductive particles into polypropylene, polyester, acrylic acid, polyamide and viscose fibers can also be added. In the embodiment, the weight percentages of polypropylene, polyester, acrylic acid, polyamide and viscose fiber in the conductive polymer are: 60% to 64% for the polypropylene, 20% to 24% for the polyester, 0.5% to 2% for the acrylic acid, 0.5% to 2% for the polyamide, and 2% to 6% for the viscose fiber.

The step S3 would be executed after S1: melting the conductive polymer, which is mainly melted by heating. Followed by step S5: extruding molten conductive polymer to form a plurality of conductive polymer fibers. Then, step S7 is: covering the wire with the plurality of conductive polymer fibers. Finally perform the step S9: curing the plurality of conductive polymer fibers to form an electromagnetic shielding layer that covers the wire.

Figure 8:
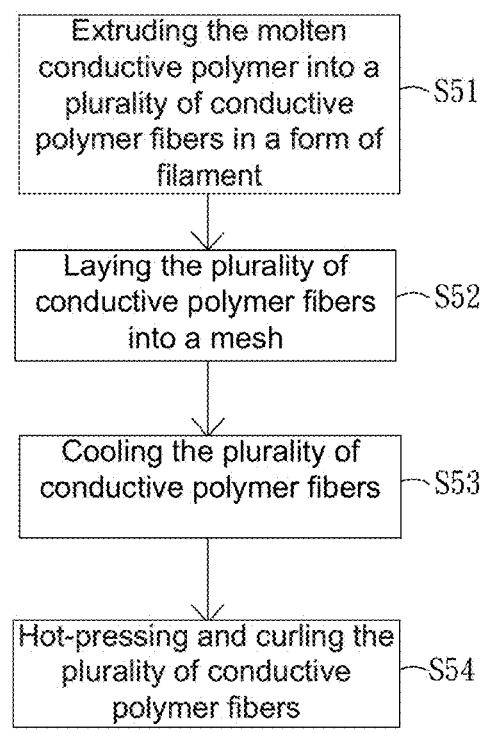
FIG. 8 is a flowchart of step S5 of the third embodiment of the present disclosure.

FIG. 8 is a flowchart of step S5 of the third embodiment of the present disclosure. In this embodiment, step S5 is to first execute step S51 to extrude the molten conductive polymer into a plurality of conductive polymer fibers in a form of filament. In step S52, the plurality of conductive polymer fibers is laid into a mesh. In this embodiment, the plurality of conductive polymer fibers are woven or overlapped in a molten state, and the plurality of molten conductive polymer fibers can be bonded to each other at the overlaps so that the plurality of conductive polymer fibers are laid into a mesh. Step S53 is executed to cool the plurality of conductive polymer fibers. Finally to execute the step S54 to hot-press and curl the plurality of meshed conductive polymer fibers.

Figure 9:
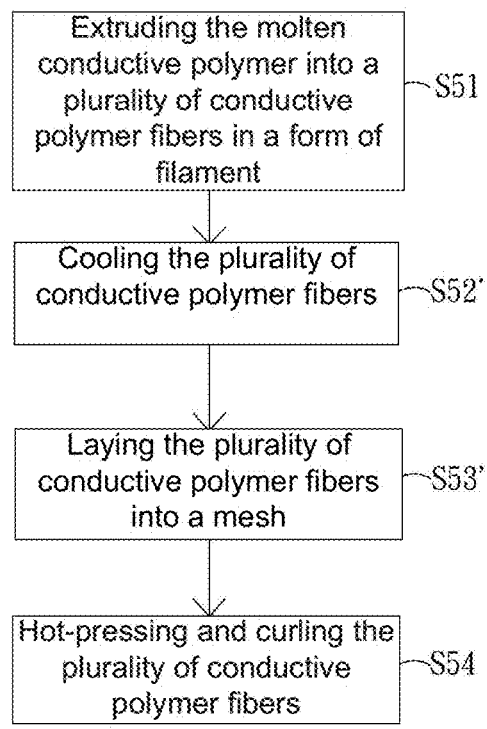
FIG. 9 is a flowchart of step S5 of the fourth embodiment of the present disclosure.

FIG. 9 is a flowchart of step S5 of the fourth embodiment of the present disclosure. As shown in the figure, the difference of step S5 of this embodiment and that of the third embodiment is as follows. After executing step S51, which is to extrude the molten conductive polymer into a plurality of conductive polymer fibers in the form of filament, step S52' is performed to cool the plurality of conductive polymer fibers followed by step S53', in which the plurality of conductive polymer fibers is laid into a mesh. In this embodiment, the plurality of conductive polymer fibers are woven or overlapped in a cooled state, and the plurality of conductive polymer fibers can be molten and bonded to each other at the overlaps; alternatively, the conductive polymer fibers can simply to be woven into a mesh. Finally to perform step S54 to hot-press and curl the plurality of meshed conductive polymer fibers.

Figure 10:
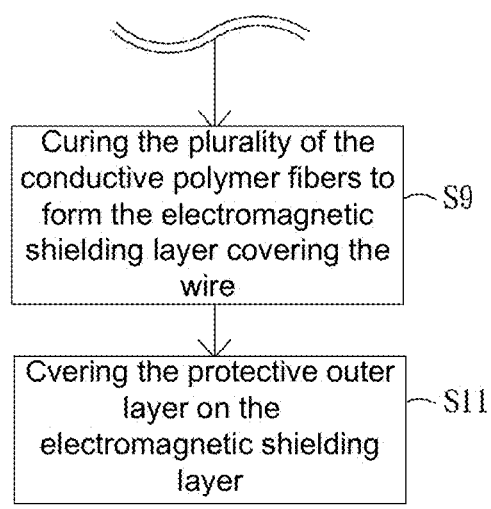
FIG. 10 is a flowchart of a manufacturing method of a cable of the fifth embodiment of the present disclosure.

FIG. 10 is a flowchart of a manufacturing method of a cable of the fifth embodiment of the present disclosure. As shown in the figure, the difference of the manufacturing method of this embodiment and that of the third embodiment is as follows. After performing steps S1 to S9 of FIG. 7, a step S11 is further performed after step S9 to cover the electromagnetic shielding layer 13 with a protective outer layer 15. The protective outer layer 15 can further serve as a waterproof and dustproof member to perfectly protect the electromagnetic shielding layer 13.

In summary, the present disclosure proposed a cable comprising a wire and an electromagnetic shielding layer and a manufacturing method of the cable. The wire of the cable of the present disclosure is covered by the electromagnetic shielding layer having the conductive polymer. The electromagnetic shielding layer having the conductive polymer performs an excellent effect of shielding the electromagnetic wave of the wire. In addition, the light-weight and flexible polypropylene is used as the main material of the electromagnetic shielding layer of the present disclosure, thereby the electromagnetic shielding layer of the present disclosure is light in weight. Also, the electromagnetic shielding layer is produced by weaving or overlapping the plurality of conductive polymer fibers, making the electromagnetic shielding layer to be moderate in softness and non-directional in strength in which the strength in the longitudinal and lateral directions is similar. In addition, polypropylene is a chemically passive substance, which makes the electromagnetic shielding layer of the present disclosure have great corrosion resistance, antibacterial properties, and waterproofness. Polypropylene is also an environmentally friendly material, in which the chemical and molecular structure being relatively weak to be easily broken so that it can be effectively degraded to enter the next environmental cycle in a non-toxic form. Therefore, the electromagnetic shielding layer of the present disclosure is pretty much environmentally friendly.

It is to be understood that the term "comprises", "comprising", or any other variants thereof, is intended to encompass a non-exclusive inclusion, such that a process, method, article, or device of a series of elements not only include those elements but also comprises other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A cable, comprising:
   a wire; and
   an electromagnetic shielding layer covering the wire; the electromagnetic shielding layer being in the form of fiber mesh; the electromagnetic shielding layer comprising a conductive polymer;
   wherein the conductive polymer comprises polypropylene; the conductive polymer is doped with conductive particles; and
   wherein the conductive polymer further comprises polyester, acrylic acid, polyamide, and viscose fiber, and the polypropylene weighs 60% to 64% of the conductive polymer; the polyester weighs 20% to 24% of the conductive polymer; the acrylic acid weighs 0.5% to 2% of the conductive polymer; the polyamide weighs 0.5% to 2% of the conductive polymer; the viscose fiber weighs 2% to 6% of the conductive polymer.

2. The cable according to claim 1 further comprising a protective outer layer covering the electromagnetic shielding layer.

3. A manufacturing method of a cable, the cable comprising
   a wire; and
   an electromagnetic shielding layer covering the wire; the electromagnetic shielding layer being in the form of fiber mesh; the electromagnetic shielding layer comprising a conductive polymer;
   wherein the conductive polymer comprises polypropylene; the conductive polymer is doped with conductive particles; and
   wherein the conductive polymer further comprises polyester, acrylic acid, polyamide, and viscose fiber, and the polypropylene weighs 60% to 64% of the conductive polymer; the polyester weighs 20% to 24% of the conductive polymer; the acrylic acid weighs 0.5% to 2% of the conductive polymer; the polyamide weighs 0.5% to 2% of the conductive polymer; the viscose fiber weighs 2% to 6% of the conductive polymer,
   the manufacturing method of the cable comprising:
   feeding the conductive polymer;
   melting the conductive polymer;
   extruding the molten conductive polymer to form a plurality of conductive polymer fibers;
   covering the wire with the plurality of conductive polymer fibers; and
   curing the plurality of the conductive polymer fibers to form the electromagnetic shielding layer covering the wire.

4. The manufacturing method according to claim 3, wherein the step of feeding the conductive polymer further comprises doping the conductive particles into the polypropylene to form the conductive polymer.

5. The manufacturing method according to claim 3, further comprising covering the electromagnetic shielding layer with a protective outer layer.

6. The manufacturing method according to claim 3, wherein in the step of extruding the molten conductive polymer to form the plurality of conductive polymer fibers, the conductive polymer is extruded into the plurality of conductive polymer fibers in a form of filament; and then the plurality of conductive polymer fibers are cooled.

7. The manufacturing method according to claim 6, wherein after the step of extruding the plurality of conductive polymer fibers in the form of filament, the plurality of conductive polymer fibers is laid into a mesh.

8. The manufacturing method according to claim 7, wherein the step of laying the plurality of conductive polymer fibers into a mesh further comprises hot-pressing and curling the mesh of the conductive polymer fibers.

* * * * *